US008935476B2

(12) United States Patent
Benhase et al.

(10) Patent No.: US 8,935,476 B2
(45) Date of Patent: *Jan. 13, 2015

(54) MANAGING CACHING OF EXTENTS OF TRACKS IN A FIRST CACHE, SECOND CACHE AND STORAGE

(75) Inventors: Michael T. Benhase, Tucson, AZ (US); Lokesh M. Gupta, Tucson, AZ (US); Paul H. Muench, San Jose, CA (US); Cheng-Chung Song, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 138 days.

This patent is subject to a terminal disclaimer.

(21) Appl. No.: 13/352,220

(22) Filed: Jan. 17, 2012

(65) Prior Publication Data

US 2013/0185493 A1 Jul. 18, 2013

(51) Int. Cl.
G06F 12/06 (2006.01)
G06F 12/08 (2006.01)

(52) U.S. Cl.
USPC .................................. 711/119; 711/E12.017

(58) Field of Classification Search
None
See application file for complete search history.

(56) References Cited

U.S. PATENT DOCUMENTS

| | | | | |
|---|---|---|---|---|
| 6,088,767 | A * | 7/2000 | Dan et al. ....................... | 711/129 |
| 6,381,677 | B1 * | 4/2002 | Beardsley et al. ............ | 711/137 |
| 7,685,367 | B2 | 3/2010 | Ruia et al. | |
| 2004/0039886 | A1 * | 2/2004 | Christofferson et al. ...... | 711/156 |
| 2006/0026229 | A1 * | 2/2006 | Ari et al. ........................ | 709/203 |
| 2008/0071999 | A1 * | 3/2008 | Boyd et al. ..................... | 711/154 |
| 2008/0147974 | A1 * | 6/2008 | Madison et al. ............... | 711/118 |
| 2009/0037662 | A1 * | 2/2009 | La Frese et al. ............... | 711/136 |
| 2009/0055591 | A1 * | 2/2009 | Miwa et al. .................... | 711/122 |
| 2010/0293337 | A1 * | 11/2010 | Murphy et al. ................ | 711/136 |
| 2011/0022801 | A1 | 1/2011 | Flynn | |
| 2012/0072652 | A1 * | 3/2012 | Celis et al. ..................... | 711/103 |

OTHER PUBLICATIONS

"IBM Easy Tier Enables DS8700 Users to Make Good Use of Solid State Drives", from Mesabi Group LLC, by David Hill, Apr. 2010.
Preliminary Remarks for U.S. Appl. No. 13/778,018, filed Feb. 26, 2013, 2 pp.
US Patent Application with U.S. Appl. No. 13/778,018, filed Feb. 26, 2013, entitled "Managing Caching of Extents of Tracks in a First Cache, Second Cache and Storage", invented by M.T. Benhase et al., 38 pp.
Office Action dated Sep. 27, 2013, pp. 37, for U.S. Appl. No. 13/778,018, filed Feb. 26, 2013.

(Continued)

*Primary Examiner* — Charles Rones
*Assistant Examiner* — Tian-Pong Chang
(74) *Attorney, Agent, or Firm* — David W. Victor; Konrad Raynes Davda & Victor LLP

(57) ABSTRACT

Provided are a computer program product, system, and method for managing caching of extents of tracks in a first cache, second cache and storage device. A determination is made of an eligible track in a first cache eligible for demotion to a second cache, wherein the tracks are stored in extents configured in a storage device, wherein each extent is comprised of a plurality of tracks. A determination is made of an extent including the eligible track and whether second cache caching for the determined extent is enabled or disabled. The eligible track is demoted from the first cache to the second cache in response to determining that the second cache caching for the determined extent is enabled. Selection is made not to demote the eligible track in response to determining that the second cache caching for the determined extent is disabled.

24 Claims, 13 Drawing Sheets

(56) References Cited

OTHER PUBLICATIONS

Response dated Dec. 26, 2013, pp. 12, to Office Action dated Sep. 27, 2013, pp. 37, for U.S. Appl. No. 13/778,018, filed Feb. 26, 2013.

Final Office Action, dated May 7, 2014, for U.S. Appl. No. 13/778,018, filed Feb. 26, 2013, entitled "Managing Caching of Extents of Tracks in a First Cache, Second Cache and Storage", invented by Michael T. Benhase et al., Total 31 pages.

Response dated Aug. 7, 2014, pp. 9, to Final Office Action dated May 7, 2014, pp. 31, for U.S. Appl. No. 13/778,018, filed Feb. 26, 2013.

Notice of Allowance dated Sep. 4, 2014, pp. 16, for U.S. Appl. No. 13/778,018, filed Feb. 26, 2013.

* cited by examiner

MANAGING CACHING OF EXTENTS OF TRACKS IN A FIRST CACHE, SECOND CACHE AND STORAGE

BACKGROUND OF THE INVENTION

1. Field of the Invention

The present invention relates to a computer program product, system, and method for managing caching of extents of tracks in a first cache, second cache and storage.

2. Description of the Related Art

A cache management system buffers tracks in a storage device recently accessed as a result of read and write operations in a faster access storage device, such as memory, than the storage device storing the requested tracks. Subsequent read requests to tracks in the faster access cache memory are returned at a faster rate than returning the requested tracks from the slower access storage, thus reducing read latency. The cache management system may also return complete to a write request when the modified track directed to the storage device is written to the cache memory and before the modified track is written out to the storage device, such as a hard disk drive. The write latency to the storage device is typically significantly longer than the latency to write to a cache memory. Thus, using cache also reduces write latency.

A cache management system may maintain a linked list having one entry for each track stored in the cache, which may comprise write data buffered in cache before writing to the storage device or read data. In the commonly used Least Recently Used (LRU) cache technique, if a track in the cache is accessed, i.e., a cache "hit", then the entry in the LRU list for the accessed track is moved to a Most Recently Used (MRU) end of the list. If the requested track is not in the cache, i.e., a cache miss, then the track in the cache whose entry is at the LRU end of the list may be removed (or destaged back to storage) and an entry for the track data staged into cache from the storage is added to the MRU end of the LRU list. With this LRU cache technique, tracks that are more frequently accessed are likely to remain in cache, while data less frequently accessed will more likely be removed from the LRU end of the list to make room in cache for newly accessed tracks.

The Easy Tier application offered by International Business Machines Corporation ("IBM") migrates extents of frequently accessed data from hard disk drive storage to a solid state storage device (SSD), which has faster access than the disk drives. The Easy Tier application monitors Input/Output (I/O) workload to extents of tracks, and if the workload or activity with respect to the extent reaches a certain threshold, then the Easy Tier application migrates the extent to the SSD where access times are improved. In this way, "hot extents", those frequently accessed, are migrated to the SSD, while "cold extents", those deemed less frequently accessed, are migrated from the SSD to the hard disk drives.

There is a need in the art for improved techniques for using cache in a storage system.

SUMMARY

Provided are a computer program product, system, and method for managing caching of extents of tracks in a first cache, second cache and storage device. A determination is made of an eligible track in a first cache eligible for demotion to a second cache, wherein the tracks are stored in extents configured in a storage device, wherein each extent is comprised of a plurality of tracks. A determination is made of an extent including the eligible track and whether second cache caching for the determined extent is enabled or disabled. The eligible track is demoted from the first cache to the second cache in response to determining that the second cache caching for the determined extent is enabled. Selection is made not to demote the eligible track in response to determining that the second cache caching for the determined extent is disabled.

DETAILED DESCRIPTION

Described embodiments provide techniques to manage the migration of extents of tracks in a storage device to a second cache that provides a secondary cache to a first cache, where host read and write activity is directed to the first cache. The second cache stores tracks being transferred between the first cache and the storage device, where the first cache may comprise a faster access device than the second cache and the second cache may comprise a faster access device than the storage device. With described embodiments, tracks are demoted from the first cache to the second cache if second cache caching is enabled for the extent. The second cache caching for an extent in the second cache is disabled if an activity level of destage and stage operations for the extent exceed an activity threshold and if a distribution of the tracks in the extent subject to destage and stage operations exceeds a distribution threshold. This prevents the first cache from demoting an eligible track to the second cache that is in an extent already in the second cache that has a relatively high amount of activity and distribution of activity. Caching to the tracks in the extent in the second cache may be enabled after a predetermined time or after the extent is migrated from the second cache back to the storage.

Figure 1:
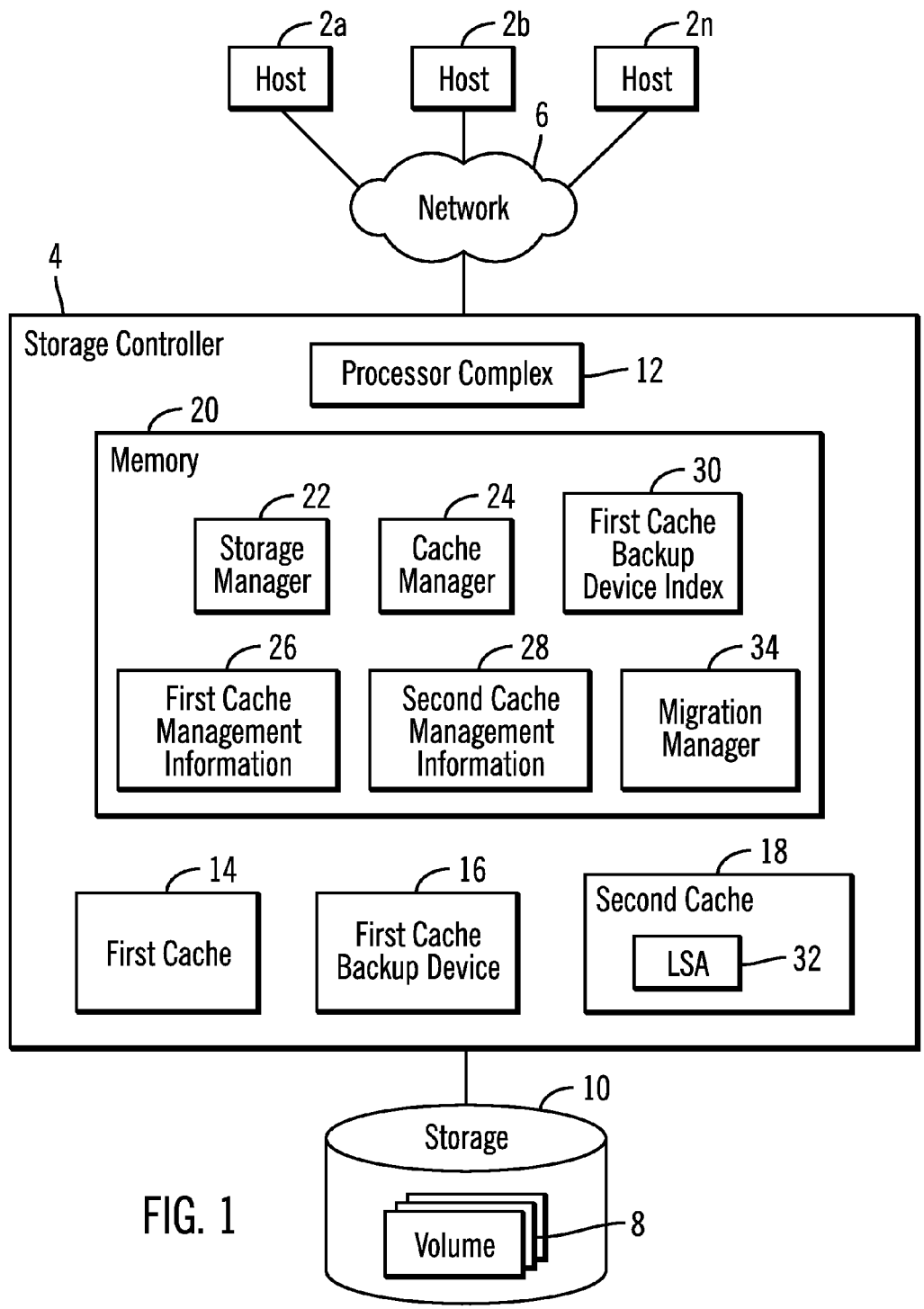
FIG. 1 illustrates an embodiment of a computing environment.

FIG. 1 illustrates an embodiment of a computing environment. A plurality of hosts 2a, 2b . . . 2n may submit Input/Output (I/O) requests to a storage controller 4 over a network 6 to access data at volumes 8 (e.g., Logical Unit Numbers, Logical Devices, Logical Subsystems, etc.) in a storage 10. The storage controller 4 includes a processor complex 12, including one or more processors with single or multiple cores, a first cache 14, a first cache backup device 16, to backup tracks in the cache 14, and a second cache 18. The first 14 and second 18 caches cache data transferred between the hosts 2a, 2b . . . 2n and the storage 10. The first cache backup device 16 may provide non-volatile storage of tracks in the first cache 14. In a further embodiment, the first cache backup device 16 may be located in a cluster or hardware on a different power boundary than that of the first cache 14.

The storage controller 4 has a memory 20 that includes a storage manager 22 for managing the transfer of tracks transferred between the hosts 2a, 2b . . . 2n and the storage 10 and a cache manager 24 that manages data transferred between the hosts 2a, 2b . . . 2n and the storage 10 in the first cache 14, first cache backup device 16, and the second cache 18. A track may comprise any unit of data configured in the storage 10, such as a track, Logical Block Address (LBA), etc., which is part of a larger grouping of tracks, such as a volume, logical device, etc. The cache manager 24 maintains first cache management information 26 and second cache management information 28 to manage read (unmodified) and write (modified) tracks in the first cache 14 and the second cache 18. A first cache backup device index 30 provides an index of track identifiers to a location in the first cache backup device 16.

The storage manager 22 may configure extents in the storage 10, where each extent is assigned a plurality of tracks in the storage 10. In this way, the storage 10 manages tracks in groups of extents, whereas the cache manager 24 manages tracks in the first 14 and second 18 caches.

The second cache 18 may store tracks in a log structured array (LSA) 32, where tracks are written in a sequential order as received, thus providing a temporal ordering of the tracks written to the second cache 18. In a LSA, later versions of tracks already present in the LSA are written at the end of the LSA 32. In alternative embodiments, the second cache 18 may store data in formats other than in an LSA.

The storage controller 4 may further include a migration manager 34 that manages the migration of extents between the storage 10 and the second cache 18. In certain embodiments, the migration manager 34 may migrate extents in the storage 10 to the second cache 18 that have a high level of activity, such as a high level of being subject to destage and stage operations. The migration manager 34 may be part of the storage manager 22 or a separate program.

The storage manager 22, cache manager 24, and migration manager 34 are shown in FIG. 1 as program code loaded into the memory 20 and executed by the processor complex 12. Alternatively, some or all of the functions may be implemented in hardware devices in the storage controller 4, such as in Application Specific Integrated Circuits (ASICs).

In one embodiment, the first cache 14 may comprise a Random Access Memory (RAM), such as a Dynamic Random Access Memory (DRAM), and the second cache 18 may comprise a flash memory, such as a solid state device, and the storage 10 is comprised of one or more sequential access storage devices, such as hard disk drives and magnetic tape. The storage 10 may comprise a single sequential access storage device or may comprise an array of storage devices, such as a Just a Bunch of Disks (JBOD), Direct Access Storage Device (DASD), Redundant Array of Independent Disks (RAID) array, virtualization device, etc. In one embodiment, the first cache 14 is a faster access device than the second cache 18, and the second cache 18 is a faster access device than the storage 10. Further, the first cache 14 may have a greater cost per unit of storage than the second cache 18 and the second cache 18 may have a greater cost per unit of storage than storage devices in the storage 10.

The first cache 14 may be part of the memory 20 or implemented in a separate memory device, such as a DRAM. In one embodiment, the first cache backup device 16 may comprise a non-volatile backup storage (NVS), such as a non-volatile memory, e.g., battery backed-up Random Access Memory (RAM), static RAM (SRAM), etc.

The network 6 may comprise a Storage Area Network (SAN), a Local Area Network (LAN), a Wide Area Network (WAN), the Internet, and Intranet, etc.

Figure 2:
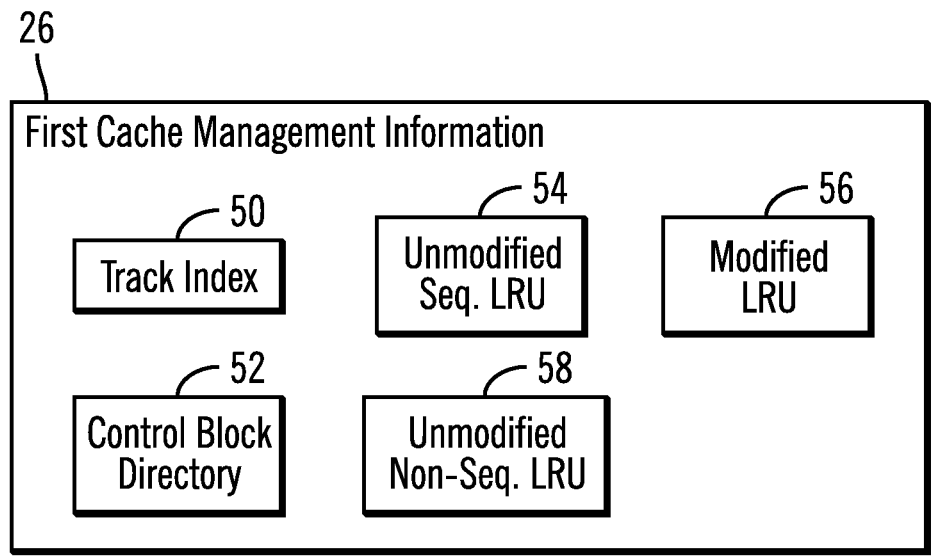
FIG. 2 illustrates an embodiment of first cache management information.

FIG. 2 illustrates an embodiment of the first cache management information 26 including a track index 50 providing an index of tracks in the first cache 14 to control blocks in a control block directory 52; an unmodified sequential LRU list 54 providing a temporal ordering of unmodified sequential tracks in the first cache 14; a modified LRU list 56 providing a temporal ordering of modified sequential and non-sequential tracks in the first cache 14; and an unmodified non-sequential LRU list 58 providing a temporal ordering of unmodified non-sequential tracks in the first cache 14.

In certain embodiments, upon determining that the first cache backup device 16 is full, the modified LRU list 56 is used to destage modified tracks from the first cache 14 so that the copy of those tracks in the first cache backup device 16 may be discarded to make room in the first cache backup device 16 for new modified tracks.

Figure 3:
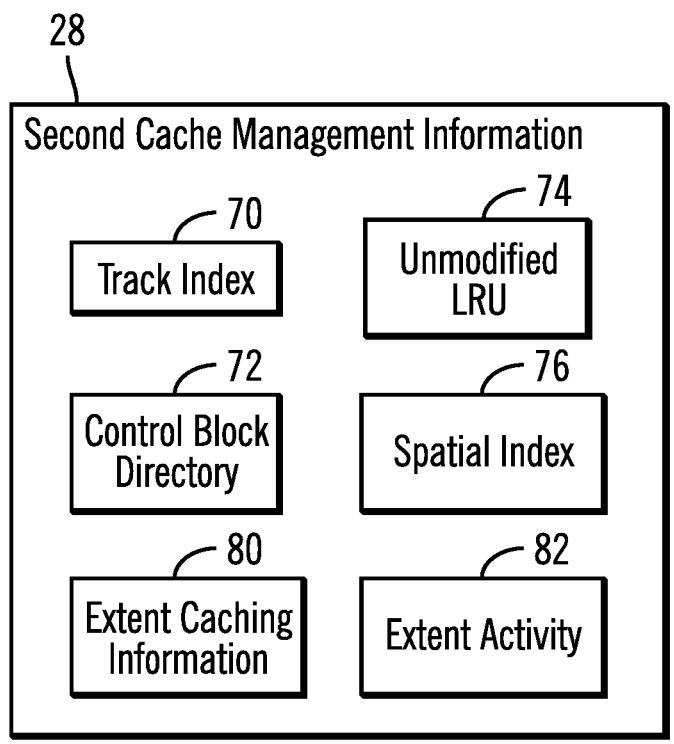
FIG. 3 illustrates an embodiment of second cache management information.

FIG. 3 illustrates an embodiment of the second cache management information 28 including a track index 70 providing an index of tracks in the second cache 18 to control blocks in a control block directory 72; an unmodified list 74 providing a temporal ordering of unmodified tracks in the second cache 18; a spatial index 76 providing a spatial ordering of the modified tracks in the second cache 18 based on the physical locations in the storage 10 at which the modified tracks are stored; extent caching information 80 providing information on extents in the second cache 18 that have been migrated from the storage 10; and extent activity 80 providing information on read/stage and write/destage activity with respect to extents in the second cache 18 or the storage 10.

All the LRU lists 54, 56, 58, and 74 may include the track IDs of tracks in the first cache 14 and the second cache 18 ordered according to when the identified track was last accessed. The LRU lists 54, 56, 58, and 74 have a most recently used (MRU) end indicating a most recently accessed track and a LRU end indicating a least recently used or accessed track. The track IDs of tracks added to the caches 14 and 18 are added to the MRU end of the LRU list and tracks demoted from the caches 14 and 18 are accessed from the LRU end. The track indexes 50 and 70 and spatial index 76 may comprise a scatter index table (SIT). Alternative type data structures may be used to provide the temporal ordering of tracks in the caches 14 and 18 and spatial ordering of tracks in the second cache 18.

Non-sequential tracks may comprise Online Line Transaction Processing (OLTP) tracks, which often comprise small block writes that are not fully random and have some locality of reference, i.e., have a probability of being repeatedly accessed.

Figure 4:
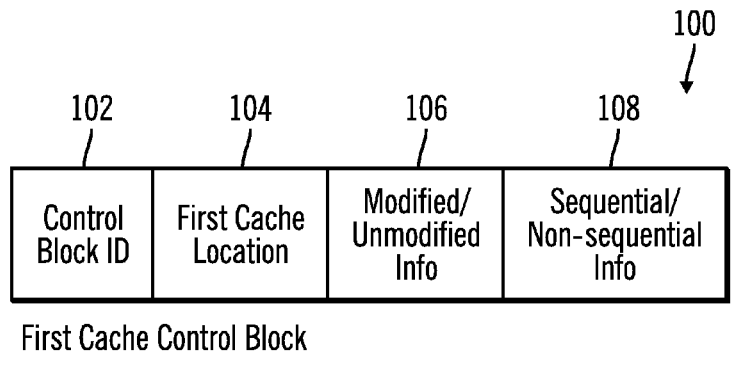
FIG. 4 illustrates an embodiment of a first cache control block.

FIG. 4 illustrates an embodiment of a first cache control block 100 entry in the control block directory 52, including a control block identifier (ID) 102, a first cache location 104 of the physical location of the track in the first cache 14, information 106 indicating whether the track is modified or unmodified, and information 108 indicating whether the track is a sequential or non-sequential access.

Figures 5, 6:
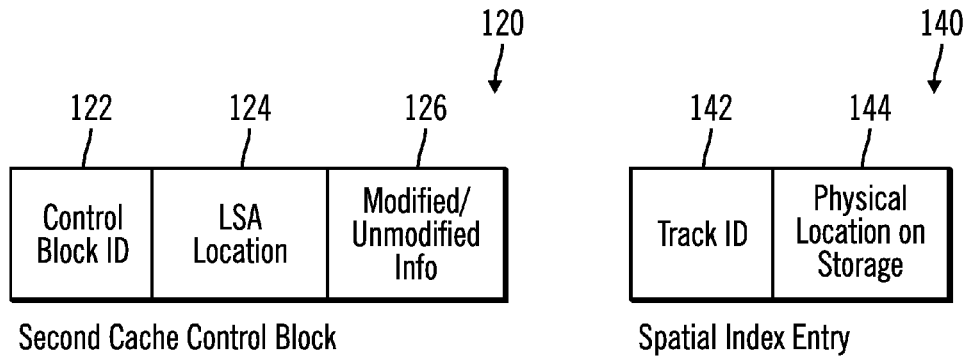
FIG. 5 illustrates an embodiment of a second cache control block.
FIG. 6 illustrates an embodiment of a spatial index entry.

FIG. 5 illustrates an embodiment of a second cache control block 120 entry in the second cache control block directory 72, including a control block identifier (ID) 122, an LSA location 124 where the track is located in the LSA 32, and information 126 indicating whether the track is modified or unmodified.

FIG. 6 illustrates a spatial index entry 140 including a track identifier 142 of a track in the second cache 18 and the physical location 144 of where the track is stored in the storage 10, such as a cylinder, platter, block address, and storage device identifier.

Figures 7, 8:
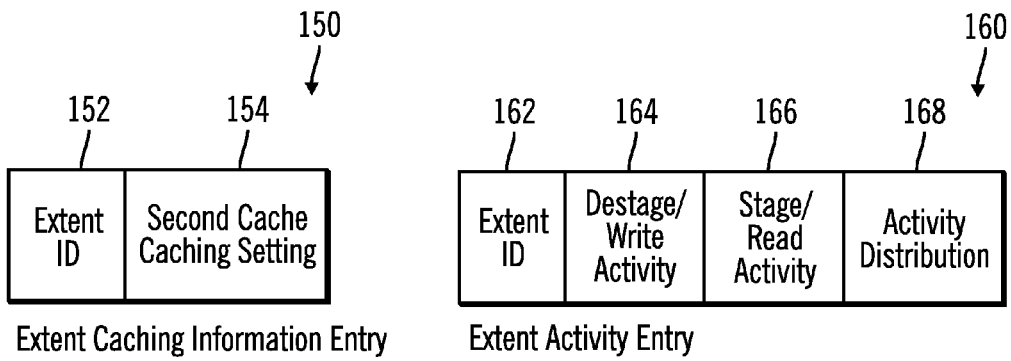
FIG. 7 illustrates an embodiment of an extent caching information entry.
FIG. 8 illustrates an embodiment of an extent activity entry.

FIG. 7 illustrates an embodiment of an instance of extent caching information entry 150 included in the extent caching information 78 for each extent in the second cache 18 indicating an extent identifier (ID) 152 of the extent and a second cache caching setting 154 indicating whether second cache caching is enabled or disabled for the extent 152 in the second cache 18. If second cache caching 154 is disabled for an extent 152 in the second cache 18, then tracks in that extent 152 cannot be demoted form the first cache 14 to the second cache 18. Further, if second cache caching 154 is disabled, then tracks in the extent 152 in the second 18 cache may not be eligible for demotion from the second cache 18 to the storage 10.

FIG. 8 illustrates an embodiment of an extent activity entry 160 included in the extent activity 80 information for each extent indicating an extent identifier (ID) 162 of the extent, a destage/write activity 164 and stage/read activity 166 indicating a number of destage/writes and stage/reads, respectively, to tracks in the extent while in the storage 10 or the second cache 18; and an activity distribution 168 indicating a distribution of the destage/stage activity with respect to different tracks of the extent. This distribution value 168 may indicate a number or proportion of tracks subject to activity, a standard deviation of tracks subject to activity, or some other indicator of the number of tracks participating in the destage/stage activity.

In one embodiment, the extent activity 164 and 166 may indicate the number of times a track in an extent located in the storage 10 or second cache 18 is written/destaged or read/staged from the first cache 14. The activity may not reflect the number of times the track is read or written while in the first cache 14, only the activity with respect to moving an extent track from the first cache 14 to the second cache 18 or storage 10.

Figure 9:
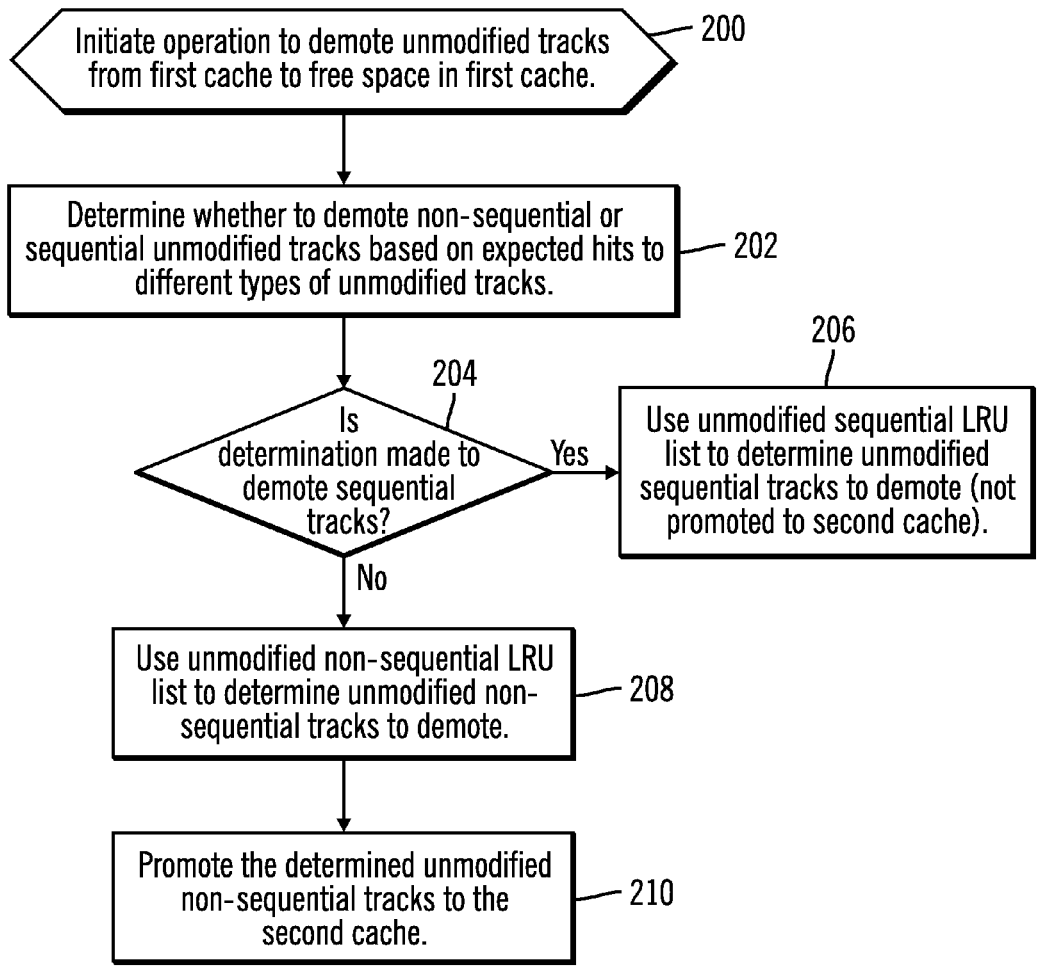
FIG. 9 illustrates an embodiment of operations to demote unmodified tracks from the first cache.

FIG. 9 illustrates an embodiment of operations performed by the cache manager 24 to demote unmodified tracks from the first cache 14. The demote operation may be initiated upon determining to free space in the first cache 14. Upon initiating (at block 200) an operation to determine whether to remove tracks from the first cache 14 to free space in the first cache 14, the cache manager 24 determines (at block 202) whether to demote non-sequential or sequential unmodified tracks based on expected hits to different types of unmodified tracks. If (at block 204) the determination is to demote unmodified sequential tracks, then the cache manager 24 uses (at block 206) the unmodified sequential LRU list 54 to determine unmodified sequential tracks to demote, from the LRU end of the list, which are not promoted to the second cache 18. If (at block 204) the determination is made to demote unmodified non-sequential tracks, then the cache manager uses the unmodified non-sequential LRU list 58 to determine (at block 208) unmodified non-sequential tracks to demote. The unmodified non-sequential tracks are promoted (at block 210) to the second cache 18.

Figure 10:
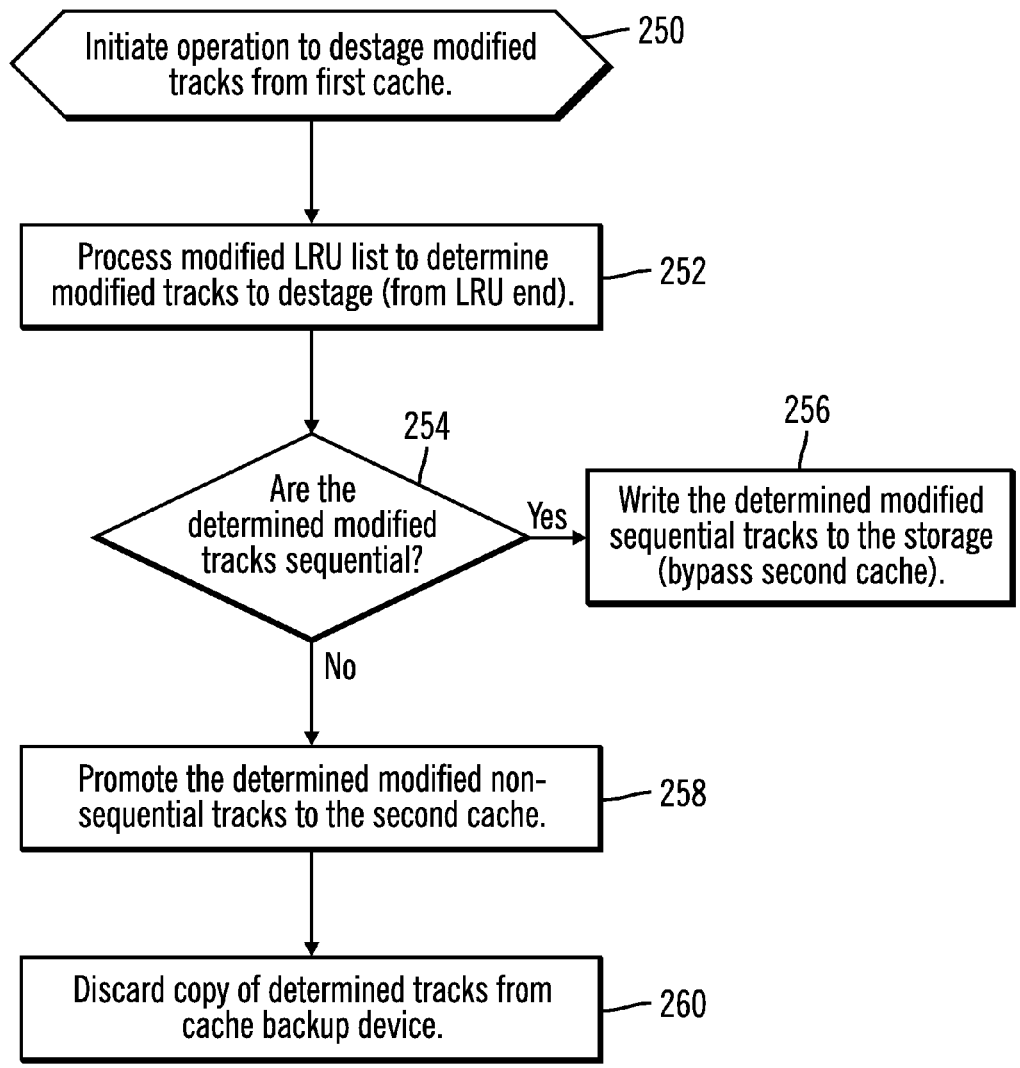
FIG. 10 illustrates an embodiment of operations to destage modified tracks from the first cache.

FIG. 10 illustrates an embodiment of operations performed by the cache manager 24 to destage modified tracks from the first cache 14. The cache manager 24 may regularly destage tracks as part of scheduled operations and increase the rate of destages if space is needed in the first cache backup device 16. Upon initiating (at block 250) the operation to destage modified tracks, the cache manager 24 processes (at bock 252) the modified LRU list 56 to determine modified tracks to destage, from the LRU end of the LRU list 56. If (at block 254) the determined modified tracks are sequential, then the cache manager 24 writes (at block 256) the determined modified sequential tracks to the storage 10, bypassing the second cache 18. If (at block 254) the modified tracks are non-sequential, then the cache manager 24 promotes (at block 258) the determined modified non-sequential tracks to the second cache 18 and discards (at block 260) the copy of the determined modified tracks from the first cache backup device 16.

With the operations of FIGS. 9 and 10, non-sequential tracks are demoted but not promoted to the second cache 18. Sequential modified (writes) are written directly to the storage 10, bypassing the second cache. Sequential unmodified tracks (reads) are discarded and not copied elsewhere, and unmodified non-sequential tracks demoted from the first cache 14 are promoted to the second cache 18.

Figure 11:
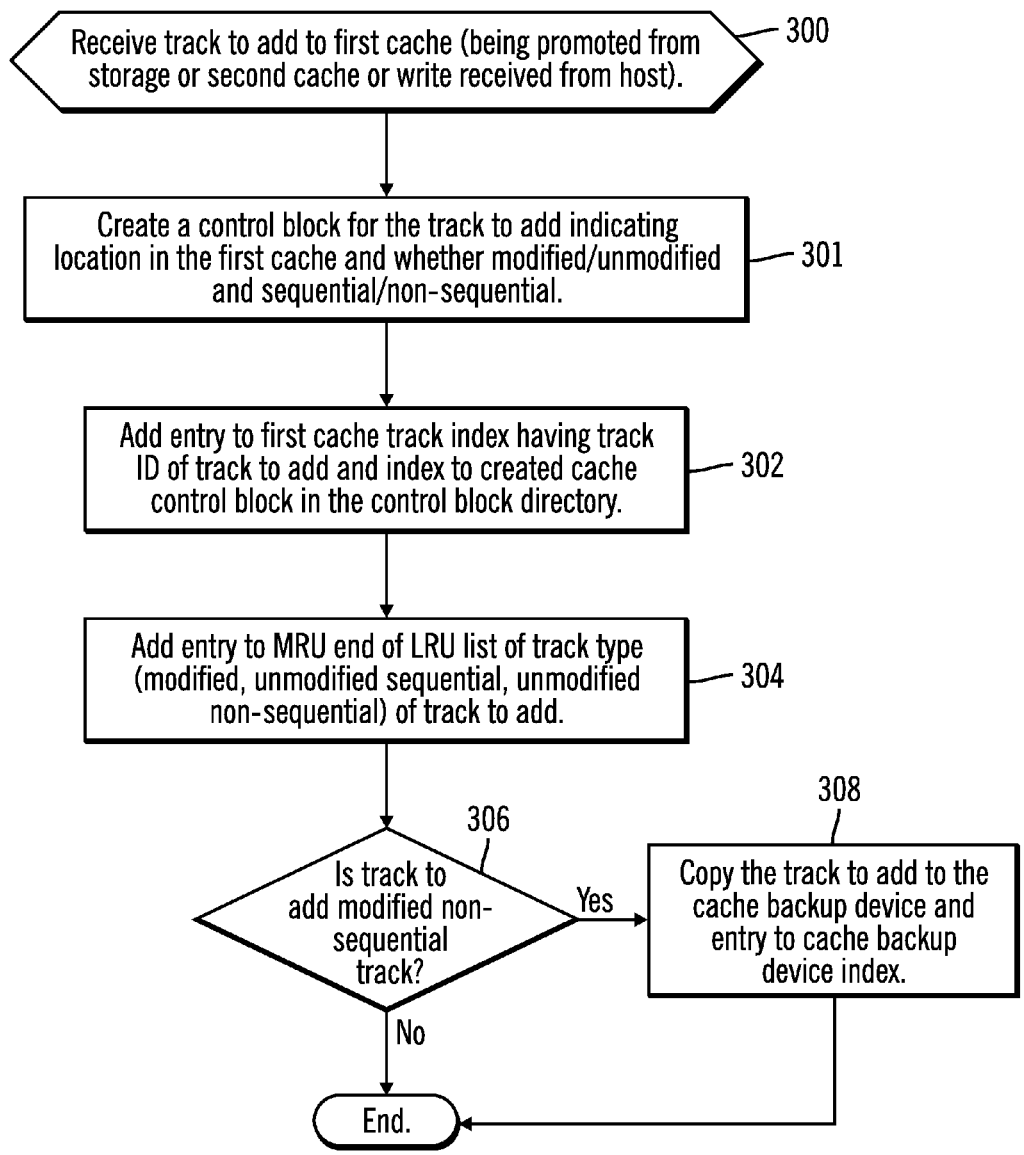
FIG. 11 illustrates an embodiment of operations to add a track to the first cache.

FIG. 11 illustrates an embodiment of operations performed by the cache manager 24 to add, i.e., promote, a track to the first cache 14, which track may comprise a write or modified track from a host 2a, 2b . . . 2n, a non-sequential track in the second cache 18 that is subject to a read request and as a result moved to the first cache 14, or read requested data not found in either cache 14 or 18 and retrieved from the storage 10. Upon receiving (at block 300) the track to add to the first cache 14, the cache manager 24 creates (at block 301) a control block 100 (FIG. 4) for the track to add indicating the 104 location in the first cache 14 and whether the track is modified/unmodified 106 and sequential/non-sequential 108. This control block 100 is added to the control block directory 52 of the first cache 14. The cache manager 24 adds (at block 302) an entry to the first cache track index 50 having the track ID of track to add and an index to the created cache control block 100 in the control block directory 52. An entry is added (at block 304) to the MRU end of the LRU list 54, 56 or 58 of the track type of the track to add. If (at block 306) the track to add is a modified non-sequential track, then the track to add is also copied (at block 308) to the first cache backup device 16 and an entry is added to the first cache backup device index 30 for the added track. If (at block 306) the track to add is unmodified sequential, control ends.

Figure 12:
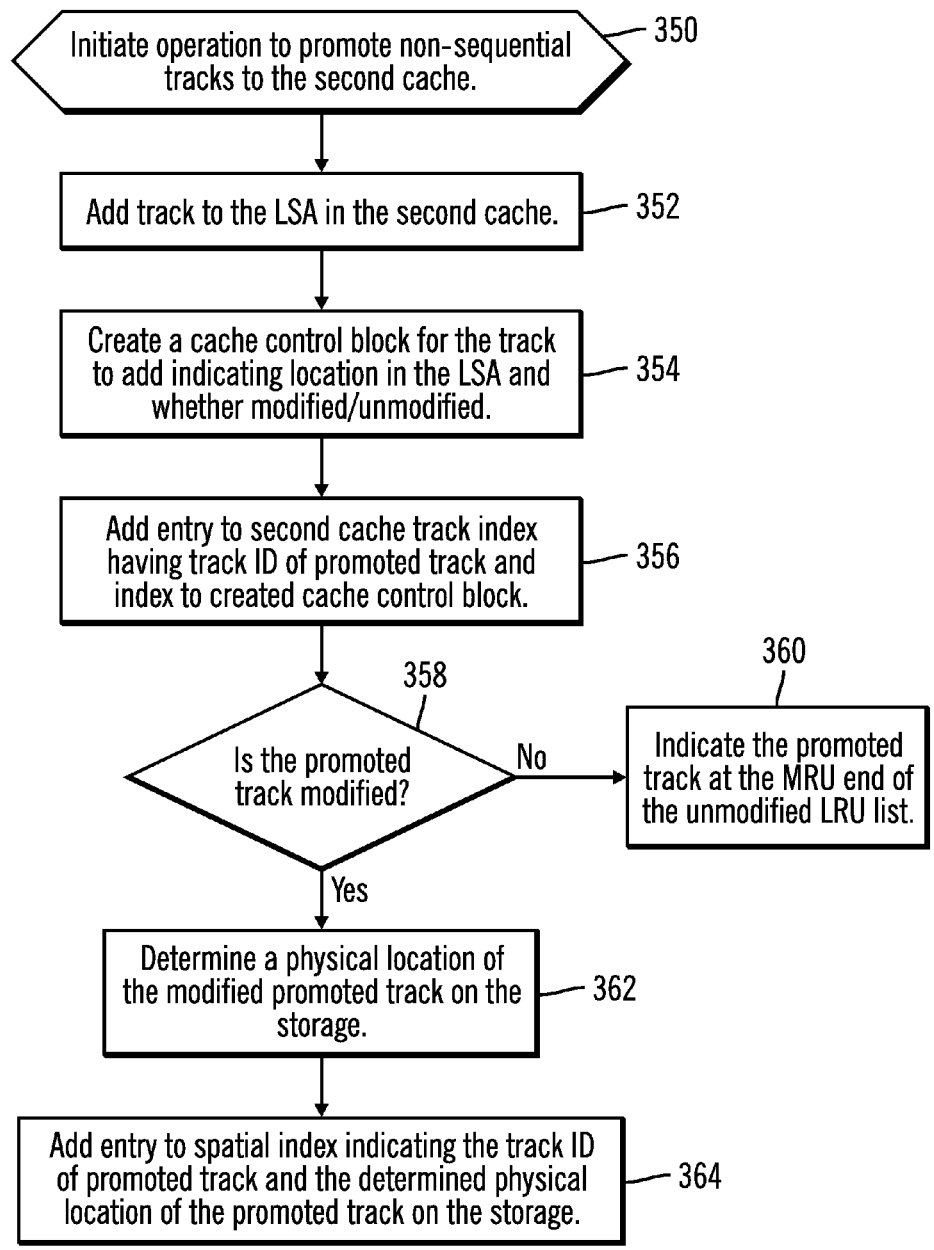
FIG. 12 illustrates an embodiment of operations to promote a track to the second cache.

FIG. 12 illustrates an embodiment of operations performed by the cache manager 24 to promote non-sequential tracks to the second cache 18 that are being demoted from the first cache 14. Upon initiating (at block 350) the operation to promote a track to the second cache 18, the cache manager 24 adds (at block 352) the track being promoted to the LSA 32 in the second cache 18 and creates (at block 354) a control block 120 (FIG. 5) for the track to add indicating the track location 124 in the LSA 32 and whether the track is modified/unmodified 126. An entry is added (at block 356) to the second cache track index 70 having the track ID of the promoted track and an index to the created cache control block 120 in the control block directory 72 for the second cache 18. If (from the no branch of block 358) the track being promoted is unmodified data, then the cache manager 24 indicates (at block 360) the promoted track at the MRU end of the unmodified LRU list 74, such as by adding the track ID to the MRU end. If (at block 358) the promoted track is modified data, then the cache manager 24 determines (at block 362) a physical location of the where to write the modified promoted track on the storage 10 and adds (at block 364) an entry to the spatial index 76 indicating the track ID 142 of the promoted track and the determined physical location 144 of the promoted track on the storage 10.

Figure 13:
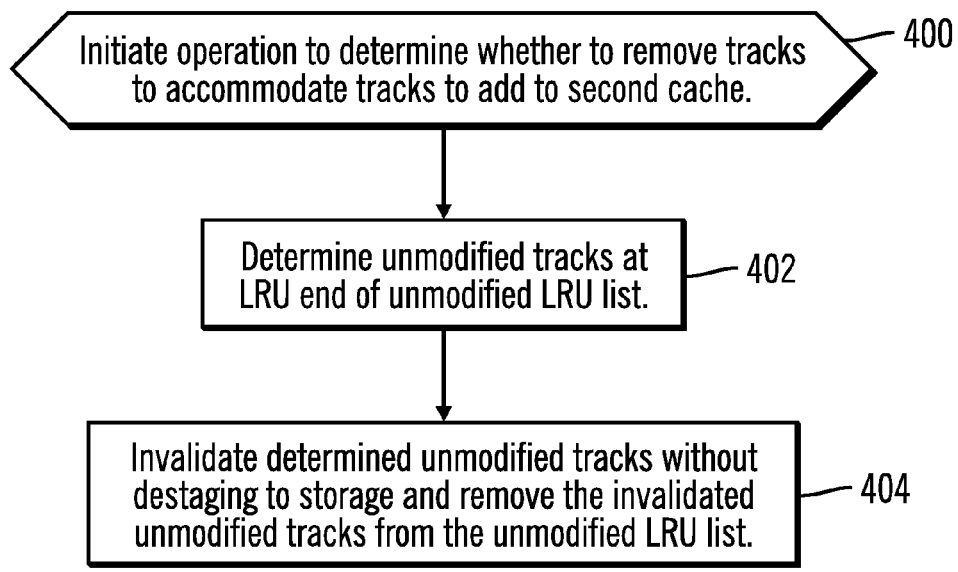
FIG. 13 illustrates an embodiment of operations to free space in the second cache.

FIG. 13 illustrates an embodiment of operations performed by the cache manager 24 to free space in the second cache 18 for new tracks to add to the second cache 18, i.e., tracks being demoted from the first cache 14 or promoted from the storage 10. Upon initiating this operation (at block 400) the cache manager 24 determines (at block 402) unmodified tracks in the second cache 18 from the LRU end of the unmodified LRU list 74 and invalidates (at block 404) the determined unmodified tracks without destaging the invalidated unmodified tracks to the storage 10, and also removes the invalidated unmodified tracks from the unmodified LRU list 74.

Figure 14:
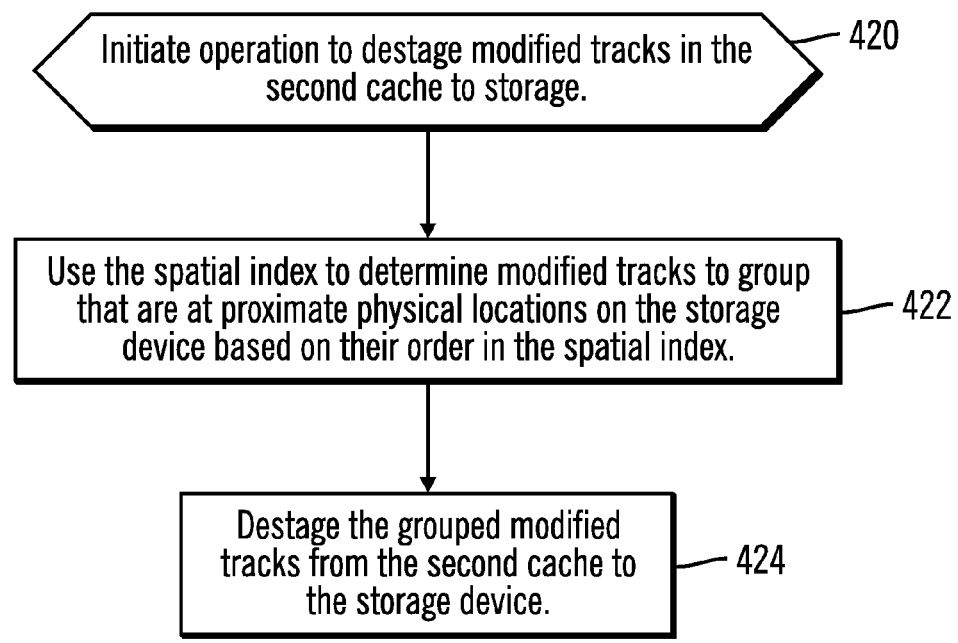
FIG. 14 illustrates an embodiment of operations to destage modified tracks from the second cache.

FIG. 14 illustrates an embodiment of operations performed by the cache manager 24 to destage modified tracks in the second cache 12 to the storage 10. Upon initiating (at block 420) the destage operation, the cache manager 24 uses (at block 422) the spatial index 76 to determine modified tracks in the second cache 18 to group that are at proximate physical locations on the storage device based on their order in the spatial index 76, such as a group of tracks at consecutive entries 140 (FIG. 6) in the location ordered spatial index 76. The determined grouped modified tracks are destaged (at block 424) from the second cache 18 to the storage device 10.

The operations of FIG. 14 optimize write operations to the storage 10, which comprises a sequential access storage device, by having the storage 10 write tracks at physical locations at closest physical proximity on the storage 10 writing surface, thus minimizing the amount of seeking and movement of the storage 10 write head to write the tracks in the second cache 18 to storage 10. The tracks were promoted to the second cache 18 from the from the first cache 16 based on temporal factors, such as their position in an LRU list 54, 56, 58, and not in an order optimized for sequential writing to a sequential access storage 10, such as a hard disk drive. Thus, the operations of FIG. 12 optimize the temporally ordered modified tracks based on their spatial location on the storage 10 to optimize writing at the storage 10.

Figure 15:
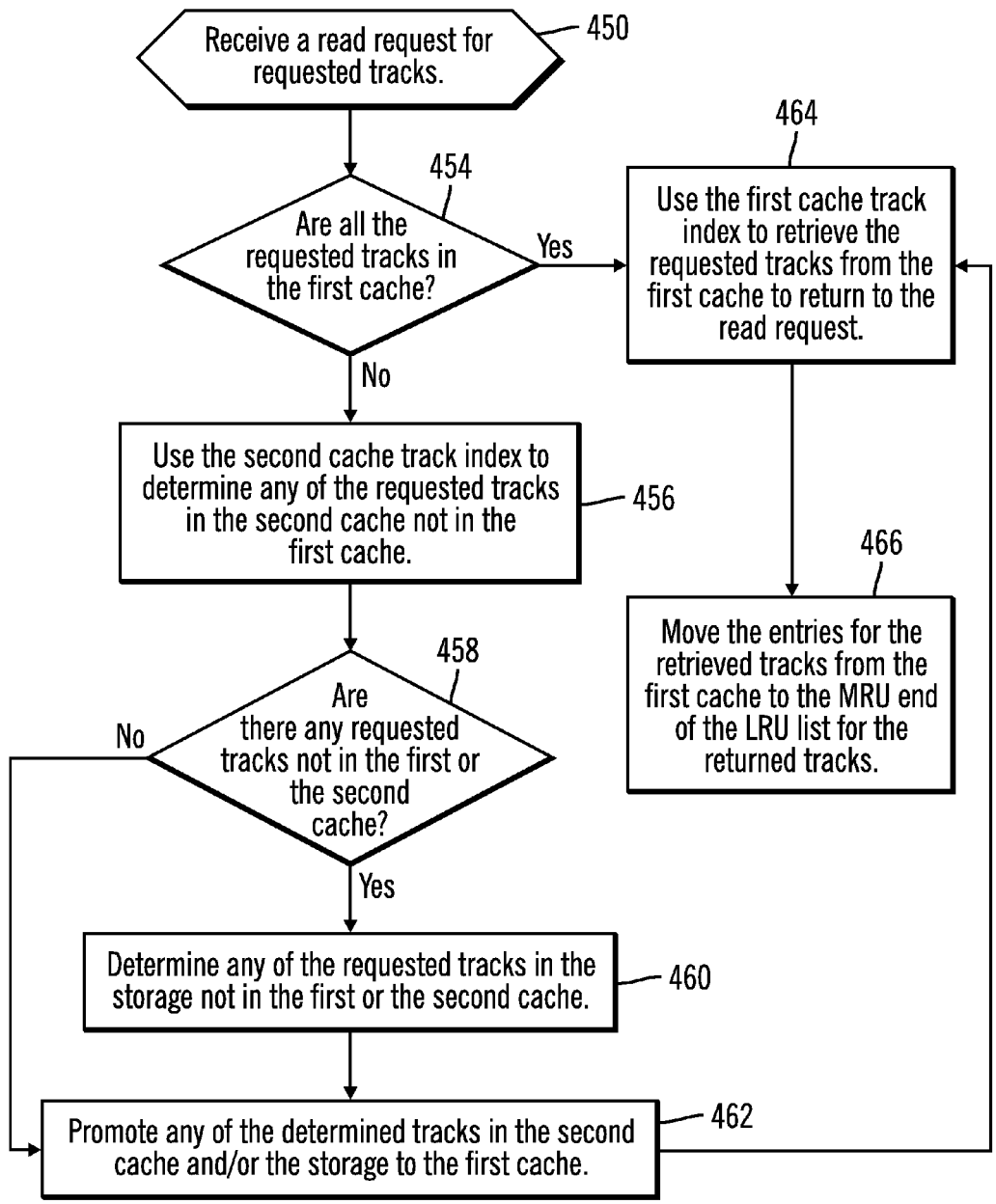
FIG. 15 illustrates an embodiment of operations to process a request for tracks to return to a read request.

FIG. 15 illustrates an embodiment of operations performed by the cache manager 24 to retrieve requested tracks for a read request from the caches 14 and 18 and storage 10. The storage manager 22 processing the read request may submit requests to the cache manager 24 for the requested tracks. Upon receiving (at block 450) the request for the tracks, the cache manager 24 uses (at block 454) the first cache track index 50 to determine whether all of the requested tracks are in the first cache 14. If (at block 454) all requested tracks are not in the first cache 14, then the cache manager 24 uses (at block 456) the second cache track index 70 to determine any of the requested tracks in the second cache 18 not in the first cache 14. If (at block 458) there are any requested tracks not found in the first 14 and second 18 caches, then the cache manager 24 determines (at block 460) any of the requested tracks in the storage 10, from the second cache track index 70, not in the first 14 and the second 18 caches. The cache manager 24 then promotes (at block 462) any of the determined tracks in the second cache 18 and the storage 10 to the first cache 14. The cache manager 24 uses (at block 464) the first cache track index 50 to retrieve the requested tracks from the first cache 14 to return to the read request. The entries for the retrieved tracks are moved (at block 466) to the MRU end of the LRU list 54, 56, 58 including entries for the retrieved tracks.

With the operations of FIG. 15, the cache manager 24 retrieves requested tracks from a highest level cache 14, then second cache 18 first before going to the storage 10, because the caches 14 and 18 would have the most recent modified version of a requested track. The most recent version is first found in the first cache 14, then the second cache 18 if not in the first cache 14 and then the storage 10 if not in either cache 14, 18.

Figure 16:
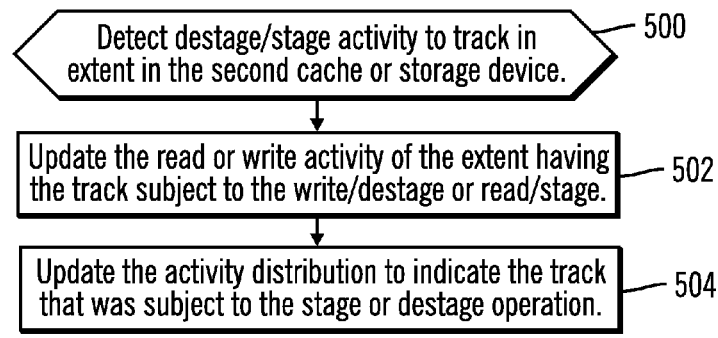
FIG. 16 illustrates an embodiment of operations to monitor destage/stage activity with respect to extents.

FIG. 16 illustrates an embodiment of operations performed by the cache manager 24 or other component, such as the storage manager 22 or migration manager 34, to maintain the extent activity 82 information. Upon detecting (at block 500) an operation that destages or stages data with respect to a track in an extent in the storage 10 or the second cache 18, the cache manager 24 updates (at block 502) the destage/write 164 or stage/read 166 activity information for the extent 162 to reflect the additional activity. The cache manager 24 may further update the activity distribution 168 information to indicate update a number of the tracks in the extent that have been subject to the stage or destage operation. The distribution 168 information indicates the number of tracks of an extent involved in the activity.

In the operations of FIG. 16, the cache manager 24 tracks destage and stage activity when the track is destaged or staged between the first cache 14 and the second cache 18, destaged or staged between the first cache 14 and the storage 10, destaged or staged between the second cache 18 and the storage 10, regardless of how many times the track is modified or read while in the first cache 14 and second cache 18. For instance, a tracked destage/stage activity resulting in the update of the extent activity information 164, 166, 168 may comprise the promotion/demotion of a track from the first cache 14 to the second cache 18 at blocks 206 and 210 in FIG. 9 and block 258 in FIG. 10; the destaging of a track from the first cache 14 to the storage 10 at block 256 in FIG. 10; the promotion or staging for a track from the storage 10 or second cache 18 to the first cache 14 at block 300 in FIG. 11; the promotion/destaging of a track from the first cache 14 to the second cache 18 at block 350 in FIG. 12; the destaging of modified tracks in the second cache 18 to the storage 10 in FIG. 14; and the staging/promotion of tracks in the second cache 18 or storage 10 to the first cache 14 at block 462 in FIG. 15.

Figure 17:
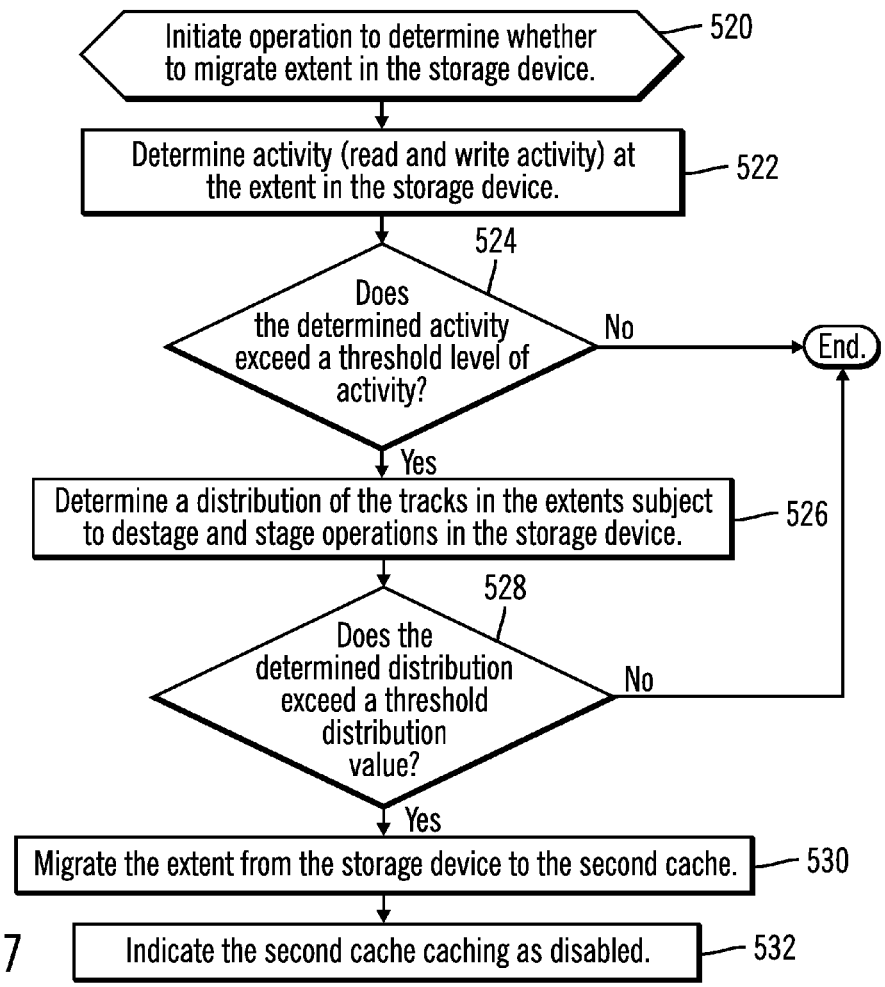
FIG. 17 illustrates an embodiment of operations to migrate an extent in the storage device.

FIG. 17 illustrates an embodiment of operations performed by the migration manager 34 to migrate an extent from the storage 10 to a faster access second cache 18. Upon (at block 520) initiating an operation to determine whether to migrate an extent in the storage 10, the migration manager 34 determines (at block 522) activity (stage 164 and/or destage 166 activity) at the extent in the storage device 10. The migration manager 34 determines (at block 524) whether determined activity (such as total stage/read 164 and destage/write 166 activity) exceeds a threshold level of activity, such as a threshold number of stage and destage operations. The measured values and threshold may comprise different measurements, such as a number of measurements over a time period. If (at block 524) the threshold level of activity is not satisfied, then control ends. Otherwise, if the threshold is met, then the migration manager 34 determines (at block 526) a distribution 168 of the tracks in the extents subject to destage and stage operations in the storage device, i.e., the proportion, number of tracks, etc., participating in the activity. If (at block 528) the determined distribution of activity does not exceed a threshold distribution value, then control ends. Otherwise, if (at block 528) the distribution level threshold is satisfied, then the migration manager 34 migrates (at block 530) the extent from the storage device 10 to the second cache 18 and indicates (at block 532) the second cache caching 154 for the extent 152 as disabled, so that tracks in the extent will not promoted to or demoted from the second cache 18.

In the described embodiments of FIG. 17, the migration manager 34 checks both the amount of activity and distribution of activity. In alternative embodiments, the migration manager 34 may check the threshold with either the magnitude of activity or the distribution.

Figure 18:
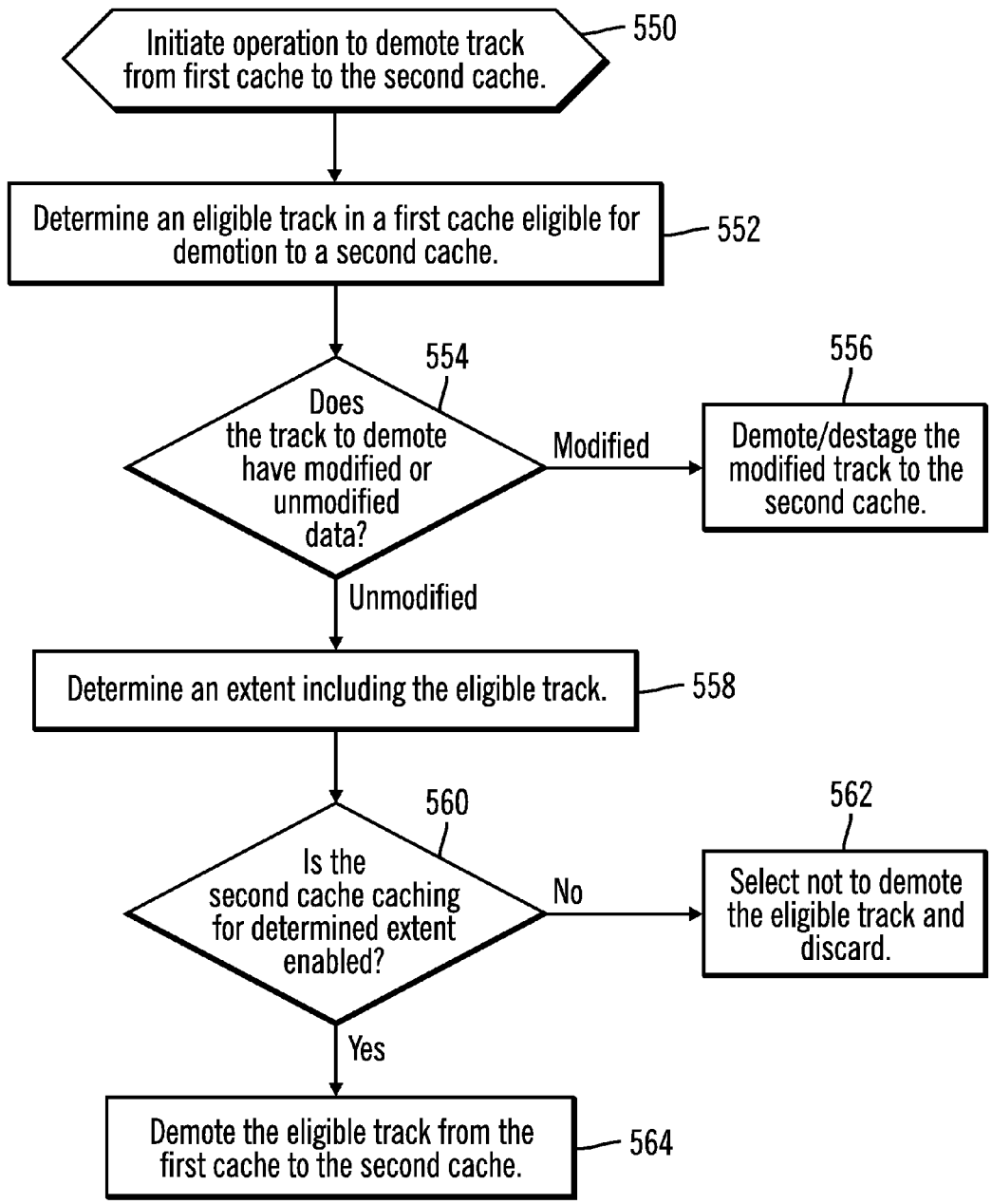
FIG. 18 illustrates an embodiment of operations to demote a track from the first cache to the second cache.

FIG. 18 illustrates an embodiment of operations performed by the cache manager 24 to demote a track from the first cache 14 to the second cache 18. Upon initiating (at block 550) an operation to demote a track from the first cache 14 to the second cache 18, the cache manager 14 determines (at block 552) an eligible track in the first cache 14 eligible for demotion to the second cache 18. A track may be determined to be eligible for demotion according to FIGS. 9, 10, and 12. If (at block 554) the track eligible to demote has modified data, then the cache manager 24 destages (at block 556) the modified data to the second cache 18 so that the second cache 18 has the most current modified version of the track. Otherwise, if (at block 554) the eligible track is unmodified, then the cache manager 24 determines (at block 558) an extent including the eligible track 558. If (at block 560) the second cache caching 154 for the determined extent is not enabled, then the cache manager 24 selects (at block 562) not to demote the eligible track and may discard the eligible track. Otherwise, if the second cache caching 154 is disabled, then the cache manager 24 demotes (at block 564) the eligible track from the first cache 14 to the second cache 18.

Figure 19:
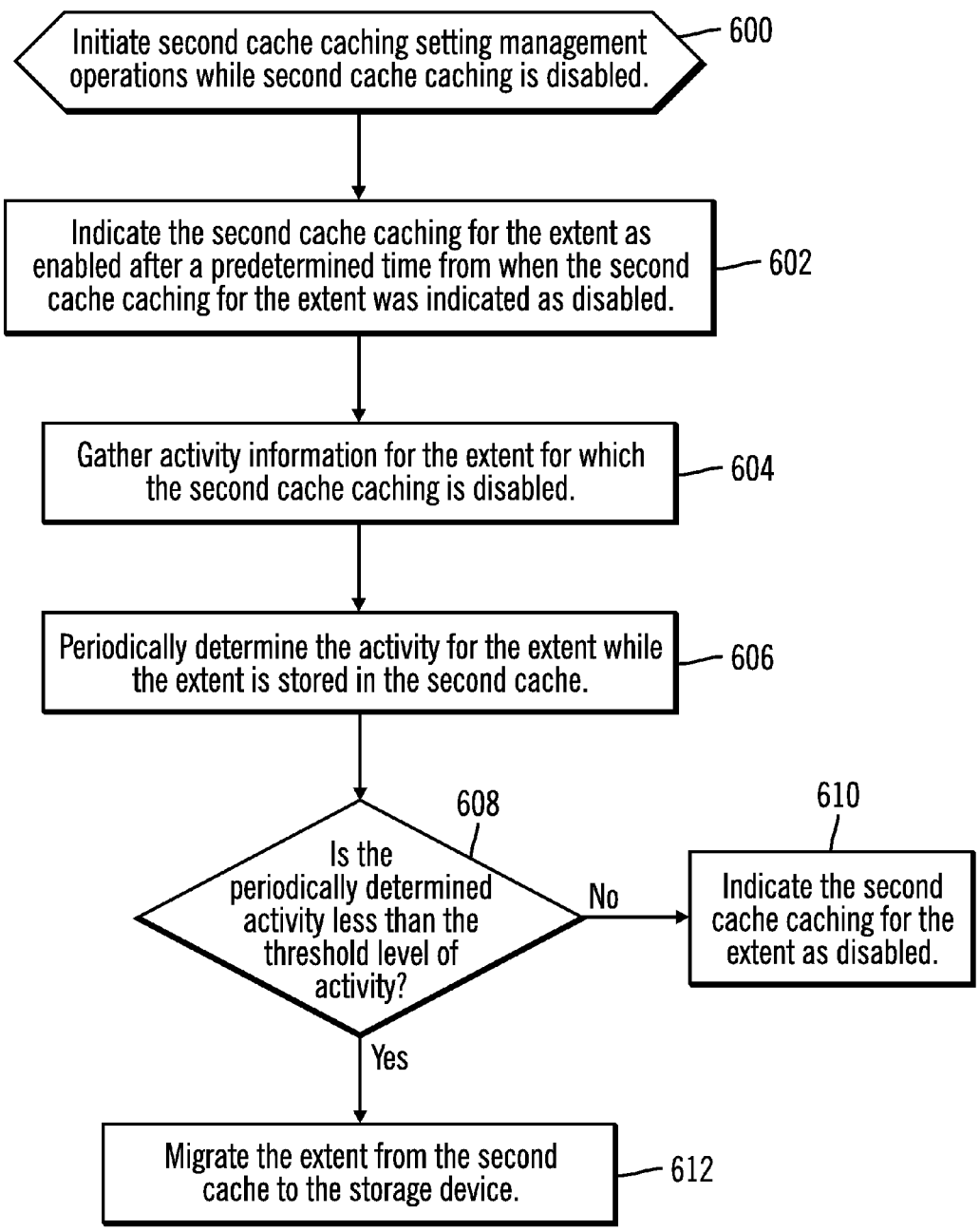
FIG. 19 illustrates an embodiment of operations to manage the second cache caching setting.

FIG. 19 illustrates an embodiment of operations performed by the cache manager 24, or another component, e.g., 22, 34, to manage the second cache caching 154 to determine whether to re-enable the second cache caching 154 after it is disabled. Upon initiating (at block 600) management of the second cache caching 154 setting while disabled, the cache manager 24 may indicate (at block 602) the second cache caching 154 for the extent as enabled after a predetermined time from when the second cache caching 154 for the extent was indicated as disabled. Further, while the second cache caching 154 is disabled, the cache manager 24 may gather (at block 604) extent activity information 160 for the extent and periodically determine (at block 606) the activity for the extent while the extent is stored in the second cache 18. If (at block 608) the periodically determined activity is greater than the threshold level of activity, then the cache manager 24 indicates (at block 610) the second cache caching 154 for the extent as disabled because the extent activity is still sufficiently high to warrant maintaining the entire extent in the second cache 18. Otherwise, if (at block 608) the determined activity for the extent has sufficiently fallen, i.e., determined activity is less than the threshold, then the cache manage 24 or migration manager 34 may migrate (at block 612) the extent form the second cache 18 to the storage device 10.

In an alternative embodiment, the second cache caching 154 for the extent may be indicated as enabled in response to determining that the periodically determined level of activity is less than the threshold level of activity.

Figure 20:
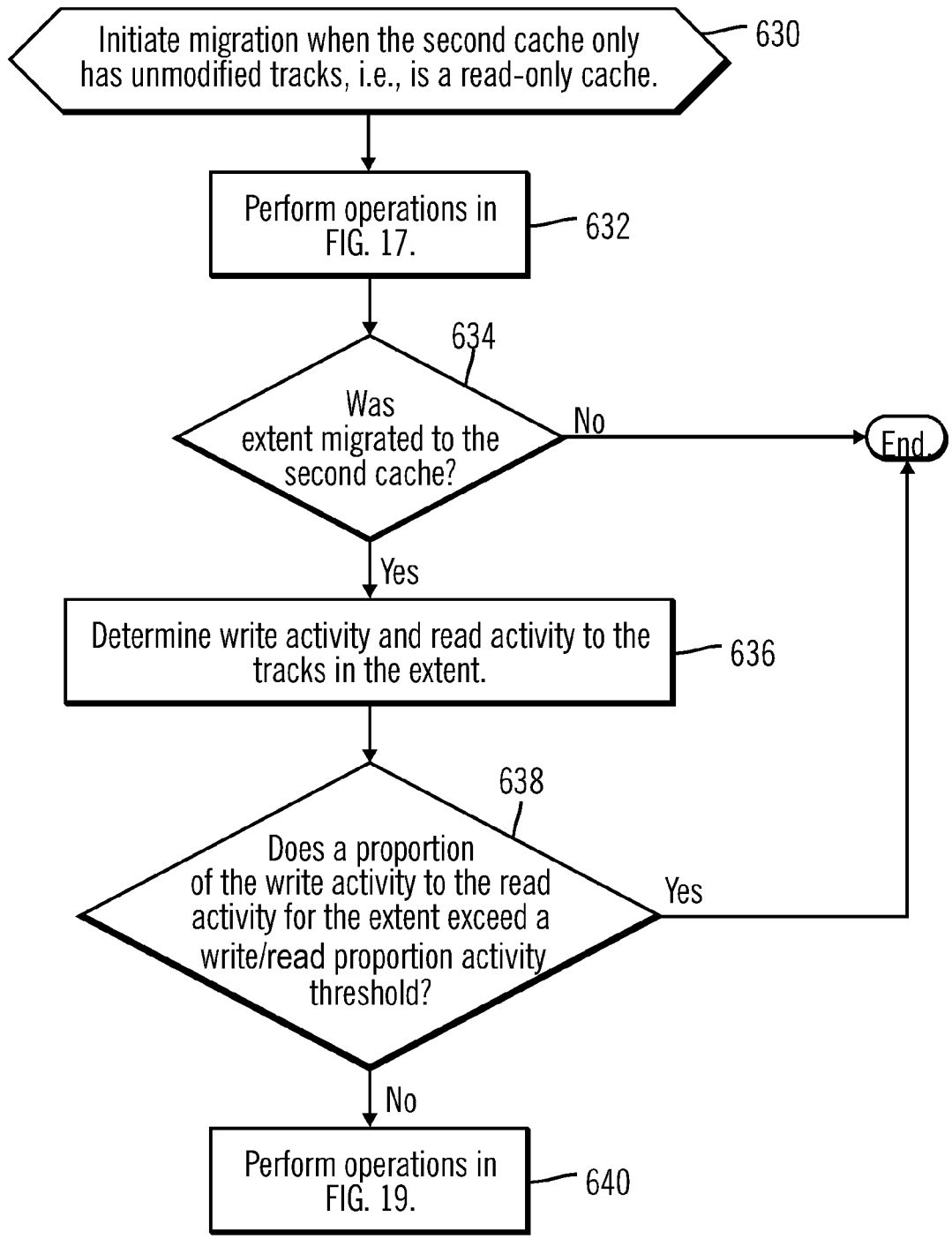
FIG. 20 illustrates an embodiment of operations to initiate migration when the second cache only has unmodified tracks.

FIG. 20 illustrates an embodiment of operations performed by the cache manager 24 and migration manager 34 to manage migration and second cache caching settings 154 when the second cache 18 is a read-only cache. Upon initiating (at block 630) migration operations, the migration manager 34 performs the operations in FIG. 17. If (at block 634) the extent was not migrated to the second cache 18 then control ends. Otherwise, if the extent was migrated to the second cache 18, then the cache manager 18 determines (at block 636) a level of write/destage 164 activity and a level of stage/read 166 activity to the tracks in the extent. If (at block 638) the destage/write activity 164 is sufficiently high, e.g., a proportion of the destage/write activity 164 to the stage/read activity 166 for the extent exceed a write-to-read proportion activity threshold, then control ends and the second cache caching setting 154 remains disabled until the extent is migrated back to the storage 10. If the proportion of read activity is sufficiently high, i.e., the proportion of write to reads is low, then the cache manager 24 performs (at block 640) the operations in FIG. 19 to determine when to enable the second cache caching 154.

Described embodiments provide techniques for managing caching operations with respect to tracks in a second cache that caches tracks between a first cache and a storage. In described embodiments, if an extent of tracks is migrated to the second cache from the storage, then the caching of tracks in the extent from the first cache to the second cache is disabled because the tracks of the extent are already maintained in the first cache. Further, caching to the tracks in the extent may be enabled after a predetermined time or after the extent is migrated from the second cache back to the storage.

The described operations may be implemented as a method, apparatus or computer program product using standard programming and/or engineering techniques to produce software, firmware, hardware, or any combination thereof. Accordingly, aspects of the embodiments may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present invention need not include the device itself.

The illustrated operations of figures showing events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims herein after appended.

What is claimed is:

1. A computer program product for managing data in a first cache, a second cache, and a storage device, the computer program product consisting of a non-transitory computer readable storage medium having computer readable program code embodied therein that executes to perform operations, the operations comprising:

determining an eligible track in the first cache eligible for demotion to the second cache, wherein the tracks are stored in extents configured in the storage device, wherein each extent is comprised of a plurality of tracks;

determining an extent including the eligible track;

determining whether second cache caching for the determined extent is enabled or disabled;

demoting the eligible track from the first cache to the second cache in response to determining that the second cache caching for the determined extent is enabled; and selecting not to demote the eligible track in response to determining that the second cache caching for the determined extent is disabled.

2. The computer program product consisting of the non-transitory computer readable storage medium of claim 1, wherein the first cache is a faster access device than the second cache and wherein the second cache is a faster access device than the storage device.

3. The computer program product consisting of the non-transitory computer readable storage medium of claim 2, wherein the first cache comprises at least one dynamic random access memory (DRAM), the second cache comprises at least one solid state storage device (SSD), and the storage device comprises at least one magnetic hard disk drive.

4. The computer program product consisting of the non-transitory computer readable storage medium of claim 1, wherein the operations of the determining whether the second cache caching for the determined extent is enabled or disabled, the demoting the eligible track from the first cache, and the selecting not to demote the eligible track are performed when the eligible track includes unmodified data, wherein the operations further comprise:

demoting the eligible tracks including modified data from the first cache to the second cache.

5. The computer program product consisting of the non-transitory computer readable storage medium of claim 1, wherein the operations further comprise:

migrating an extent from the storage device to the second cache; and indicating the second cache caching as disabled in response to the migrating of the extent to the second cache.

6. The computer program product consisting of the non-transitory computer readable storage medium of claim 5, wherein the operations further comprise:

determining activity at the extents in the storage device; and determining whether the activity for one of the extents exceeds a threshold level of activity, wherein the extent is migrated from the storage device to the second cache in response to determining that the determined activity for the extent exceeds the threshold level of activity.

7. The computer program product consisting of the non-transitory computer readable storage medium of claim 6, wherein the second cache stores only unmodified tracks demoted from the first cache, wherein the operations of the determining whether the second cache caching for the determined extent is enabled or disabled, the demoting the eligible track from the first cache, and the selecting not to demote the eligible track are performed for the eligible tracks that are unmodified, wherein the determining of the activity comprises determining a write activity to the tracks in the extent and determining a read activity to the tracks in the extent, and wherein determining whether the activity for one of the extents exceeds the threshold level of activity comprises determining whether at least one of the read activity and the write activity exceeds the threshold level of activity;

determining whether a proportion of the write activity to the read activity for the extent exceeds a write/read proportion activity threshold; and indicating that the second cache caching is enabled for the extent after a predetermined time in response to determining that the proportion is less than the write/read proportion activity threshold.

8. The computer program product consisting of the non-transitory computer readable storage medium of claim 6, wherein the operations further comprise:

gathering activity information for the extent for which the second cache caching is disabled;

periodically determining the activity for the extent while the extent is stored in the second cache;

determining whether the periodically determined activity is less than the threshold level of activity; and migrating the extent from the second cache to the storage device in response to determining that the periodically determined activity is less than the threshold level of activity.

9. The computer program product consisting of the non-transitory computer readable storage medium of claim 8, wherein the operations further comprise:

indicating the second cache caching for the extent as enabled after a predetermined time from when the second cache caching for the extent was indicated as disabled; and indicating the second cache caching for the extent as disabled in response to determining that the periodically determined activity for the extent is greater than the threshold level of activity.

10. The computer program product consisting of the non-transitory computer readable storage medium of claim 8, wherein the operations further comprise:

indicating the second cache caching for the extent as enabled in response to determining that the periodically determined activity is less than the threshold level of activity.

11. The computer program product consisting of the non-transitory computer readable storage medium of claim 6, wherein the determining of the activity comprises determining a number of destage and stage operations from the first cache or the second cache to the tracks in the extent in the storage device, wherein the threshold level of activity comprises a number of destage and stage operations to tracks in the extent in the storage device, and wherein the extent is migrated to the second cache in response to determining that the number of destage and stage operations to tracks in the extent in the storage device exceeds the threshold level of activity.

12. The computer program product consisting of the non-transitory computer readable storage medium of claim 6, wherein the determining of the activity comprises determining a distribution of the tracks in the extents located in the second cache or the storage device subject to write and read operations from the first cache, wherein the threshold level of activity comprises a threshold value reflecting a threshold distribution of destage and stage operations to the extent in the storage device, and wherein the extent is migrated to the second cache in response to determining that the determined distribution exceeds the threshold value.

13. A system coupled to a storage device, comprising:

a processor;

a first cache;

a second cache; and a computer readable storage medium having code executed by the processor to perform operations, the operations comprising:

determining an eligible track in the first cache eligible for demotion to the second cache, wherein the tracks are stored in extents configured in the storage device, wherein each extent is comprised of a plurality of tracks;

determining an extent including the eligible track;

determining whether second cache caching for the determined extent is enabled or disabled;

demoting the eligible track from the first cache to the second cache in response to determining that the second cache caching for the determined extent is enabled; and selecting not to demote the eligible track in response to determining that the second cache caching for the determined extent is disabled.

14. The system of claim 13, wherein the first cache is a faster access device than the second cache and wherein the second cache is a faster access device than the storage device.

15. The system of claim 13, wherein the operations of the determining whether the second cache caching for the determined extent is enabled or disabled, the demoting the eligible track from the first cache, and the selecting not to demote the eligible track are performed when the eligible track includes unmodified data, wherein the operations further comprise:

demoting the eligible track including modified data from the first cache to the second cache.

16. The system of claim 13, wherein the operations further comprise:

migrating an extent from the storage device to the second cache; and indicating the second cache caching as disabled in response to the migrating of the extent to the second cache.

17. The system of claim 16, wherein the operations further comprise:

determining activity at the extents in the storage device; and determining whether the activity for one of the extents exceeds a threshold level of activity, wherein the extent is migrated from the storage device to the second cache in response to determining that the determined activity for the extent exceeds the threshold level of activity.

18. The system of claim 17, wherein the second cache stores only unmodified tracks demoted from the first cache, wherein the operations of the determining whether the second cache caching for the determined extent is enabled or disabled, the demoting the eligible track from the first cache, and the selecting not to demote the eligible track are performed for the eligible tracks that are unmodified, wherein the determining of the activity comprises determining a write activity to the tracks in the extent and determining a read activity to the tracks in the extent, and wherein determining whether the activity for one of the extents exceeds the threshold level of activity comprises determining whether at least one of the read activity and the write activity exceeds the threshold level of activity;

determining whether a proportion of the write activity to the read activity for the extent exceeds a write/read proportion activity threshold; and indicating that the second cache caching is enabled for the extent after a predetermined time in response to determining that the proportion is less than the write/read proportion activity threshold.

19. The system of claim 17, wherein the operations further comprise:

gathering activity information for the extent for which the second cache caching is disabled;

periodically determining the activity for the extent while the extent is stored in the second cache;

determining whether the periodically determined activity is less than the threshold level of activity; and migrating the extent from the second cache to the storage device in response to determining that the periodically determined activity is less than the threshold level of activity.

20. The system of claim 17, wherein the determining of the activity comprises determining a number of destage and stage operations from the first cache or the second cache to the tracks in the extent in the storage device, wherein the threshold level of activity comprises a number of destage and stage operations to tracks in the extent in the storage device, and wherein the extent is migrated to the second cache in response to determining that the number of destage and stage operations to tracks in the extent in the storage device exceeds the threshold level of activity.

21. The system of claim 17, wherein the determining of the activity comprises determining a distribution of the tracks in the extents located in the second cache or the storage device subject to write and read operations from the first cache, wherein the threshold level of activity comprises a threshold value reflecting a threshold distribution of destage and stage operations to the extent in the storage device, and wherein the extent is migrated to the second cache in response to determining that the determined distribution exceeds the threshold value.

22. The system of claim 14, wherein the first cache comprises at least one dynamic random access memory (DRAM), the second cache comprises at least one solid state storage device (SSD), and the storage device comprises at least one magnetic hard disk drive.

23. The system of claim 19, wherein the operations further comprise:

indicating the second cache caching for the extent as enabled after a predetermined time from when the second cache caching for the extent was indicated as disabled; and indicating the second cache caching for the extent as disabled in response to determining that the periodically determined activity for the extent is greater than the threshold level of activity.

24. The system of claim 19, wherein the operations further comprise:

indicating the second cache caching for the extent as enabled in response to determining that the periodically determined activity is less than the threshold level of activity.

* * * * *